(12) United States Patent
Lee et al.

(10) Patent No.: US 10,476,026 B2
(45) Date of Patent: Nov. 12, 2019

(54) DISPLAY AND ELECTRONIC DEVICE INCLUDING THE SAME

(71) Applicant: SAMSUNG ELECTRONICS CO., LTD., Suwon-si, Gyeonggi-do (KR)

(72) Inventors: Min Sung Lee, Suwon-si (KR); Min Sik Kim, Yongin-si (KR); Song Hee Jung, Suwon-si (KR); Seung Jun Hyun, Seoul (KR); Moo Young Kim, Seoul (KR); Byoung Uk Yoon, Hwaseong-si (KR); Ki Huk Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 31 days.

(21) Appl. No.: 15/409,940

(22) Filed: Jan. 19, 2017

(65) Prior Publication Data

US 2017/0205927 A1    Jul. 20, 2017

(30) Foreign Application Priority Data

Jan. 20, 2016   (KR) .................. 10-2016-0006923

(51) Int. Cl.
*G06F 1/16* (2006.01)
*H01L 51/52* (2006.01)
(Continued)

(52) U.S. Cl.
CPC ........ *H01L 51/5237* (2013.01); *G06F 1/1637* (2013.01); *G06F 1/1656* (2013.01);
(Continued)

(58) Field of Classification Search
CPC ............... H01L 51/5237; H01L 27/323; H01L 2251/5338; G06F 1/1626; G06F 1/1632; G06F 1/1607; G06F 1/16
See application file for complete search history.

(56) References Cited

U.S. PATENT DOCUMENTS 8,716,932 B2    5/2014   Rappoport et al.
8,724,304 B2    5/2014   Raff et al.
(Continued)

OTHER PUBLICATIONS

Search Report and Written Opinion dated Apr. 25, 2017 in counterpart International Patent Application No. PCT/KR2017/000676.
(Continued)

*Primary Examiner* — Lunyi Lao
*Assistant Examiner* — Jarurat Suteerawongsa
(74) *Attorney, Agent, or Firm* — Nixon & Vanderhye P.C.

(57) ABSTRACT

An electronic device includes a housing that comprises a first surface, a second surface, and a side surface, the housing having at least one through-hole formed on the side surface, a flexible polymer layer that comprises a first part that is parallel to the first surface, a second part extending from the first part along the side surface, and a third part extending from the second part and inserted between the first part and the second surface, the polymer layer having at least one opening that passes through the second part and the third part, a plurality of display elements disposed on the flexible polymer layer, a display driving circuit, and at least one conductive line coupled to the polymer layer, extends along the second part, and is arranged around the opening, the through-hole and the opening being at least partially aligned with each other.

17 Claims, 13 Drawing Sheets

(51) Int. Cl.
*H01L 27/32* (2006.01)
*H04M 1/02* (2006.01)

(52) U.S. Cl.
CPC ...... *H01L 27/3276* (2013.01); *H04M 1/0266* (2013.01); *H01L 27/323* (2013.01); *H01L 2251/5338* (2013.01); *H04M 1/0274* (2013.01); *H04M 1/0277* (2013.01)

(56) References Cited

U.S. PATENT DOCUMENTS

| | | | |
|---|---|---|---|
| 8,816,977 B2 | 8/2014 | Rothkopf et al. | |
| 8,934,228 B2 | 1/2015 | Franklin et al. | |
| 9,178,970 B2 | 11/2015 | Lynch | |
| 9,184,521 B2 | 11/2015 | Chuang et al. | |
| 9,256,250 B2 | 2/2016 | Raff et al. | |
| 9,362,521 B2 | 6/2016 | Hwang | |
| 9,454,179 B2 | 9/2016 | Shin et al. | |
| 9,513,668 B2 | 12/2016 | Shin et al. | |
| 9,557,770 B2 | 1/2017 | Shin et al. | |
| 2009/0244013 A1* | 10/2009 | Eldershaw | G06F 3/041 345/173 |
| 2012/0127087 A1* | 5/2012 | Ma | G06F 1/1616 345/173 |
| 2012/0218219 A1* | 8/2012 | Rappoport | H01L 27/3276 345/174 |
| 2012/0242588 A1 | 9/2012 | Myers et al. | |
| 2012/0242592 A1 | 9/2012 | Rothkopf et al. | |
| 2012/0243151 A1 | 9/2012 | Lynch | |
| 2012/0243719 A1 | 9/2012 | Franklin et al. | |
| 2013/0279088 A1 | 10/2013 | Raff et al. | |
| 2014/0159569 A1 | 6/2014 | Hwang | |
| 2014/0218856 A1 | 8/2014 | Raff et al. | |
| 2015/0064966 A1* | 3/2015 | Chuang | H01R 13/516 439/571 |
| 2015/0144934 A1* | 5/2015 | Rappoport | G02B 27/01 257/40 |
| 2015/0286089 A1 | 10/2015 | Soejima et al. | |
| 2015/0331451 A1* | 11/2015 | Shin | G06F 3/041 345/173 |
| 2015/0334211 A1 | 11/2015 | Shin et al. | |
| 2015/0338883 A1* | 11/2015 | Farahani | G06F 1/1656 361/679.1 |
| 2016/0021227 A1 | 1/2016 | Lynch | |
| 2016/0195895 A1 | 7/2016 | Shin et al. | |
| 2016/0195896 A1 | 7/2016 | Shin et al. | |
| 2016/0195900 A1 | 7/2016 | Shin et al. | |
| 2016/0198037 A1 | 7/2016 | Shin et al. | |
| 2016/0231783 A1 | 8/2016 | Raff et al. | |

OTHER PUBLICATIONS

Extended European Search Report for EP Application No. 17741676.5 dated Dec. 12, 2018.

* cited by examiner

DISPLAY AND ELECTRONIC DEVICE INCLUDING THE SAME

CROSS-REFERENCE TO RELATED APPLICATION

This application is based on and claims priority under 35 U.S.C. § 119 to a Korean patent application filed on Jan. 20, 2016 in the Korean Intellectual Property Office and assigned Serial number 10-2016-0006923, the disclosure of which is incorporated by reference herein in its entirety.

TECHNICAL FIELD

The disclosure relates generally to a display and an electronic device including the same.

BACKGROUND

A portable electronic device, such as a smartphone, may support various multimedia functions. For example, the portable electronic device may support a camera function and a video play function. In order to support the multimedia function, the portable electronic device may include a display that may display various contents (e.g., texts, images, or videos).

The portable electronic device has a limit in the size of the display due to the characteristics of a mobile device. Further, in recent years, because the portable electronic devices have tended to be small-sized for portability and mobility, the users who intend to use a multimedia function have experienced severe inconveniences due to the limit in the sizes of the displays.

The portable electronic device may be bent such that the flexible printed circuit board surrounds a side surface of the display panel by connecting a flexible printed circuit board (FPCB) to the display panel. Accordingly, because a portion and a bent area of the flexible printed circuit board are arranged on a side surface of the display panel, a non-display area, such as a black matrix area or a bezel, may be widely formed on a front surface of the electronic device.

The above information is presented as background information only to assist with an understanding of the present disclosure.

SUMMARY

Various example of the present disclosure address at least the above-mentioned problems and/or disadvantages and to provide at least the advantages described below. Accordingly, an example aspect of the present disclosure is to provide a display that uses a bending part that extends from a portion of a side surface of a display panel, and an electronic device including the same.

In accordance with an example aspect of the present disclosure, an electronic device includes a housing that comprises a first surface that faces a first direction, a second surface that faces a second direction opposite to the first direction, and a side surface that surrounds at least a portion of a space between the first surface and the second surface, the housing including at least one through-hole formed on the side surface thereof; a flexible polymer layer comprising a first part parallel to the first surface, a second part extending from a peripheral portion of the first part along at least a portion of the side surface, and a third part extending from the second part and inserted between the first part and the second surface of the housing, the polymer layer including at least one opening that passes through a portion of the second part and a portion of the third part; a plurality of display elements coupled to a surface of the first part of the polymer layer, which faces the first direction; a display driving circuit connected with the third part; and at least one conductive line that is coupled to the polymer layer, extends along the second part, is electrically connected with the display elements and the display drive circuit, and is arranged around the opening, the through-hole and the opening being at least partially aligned with each other.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, it should be noted that like reference numbers are used to depict the same or similar elements, features, and structures.

DETAILED DESCRIPTION

Figure 1:
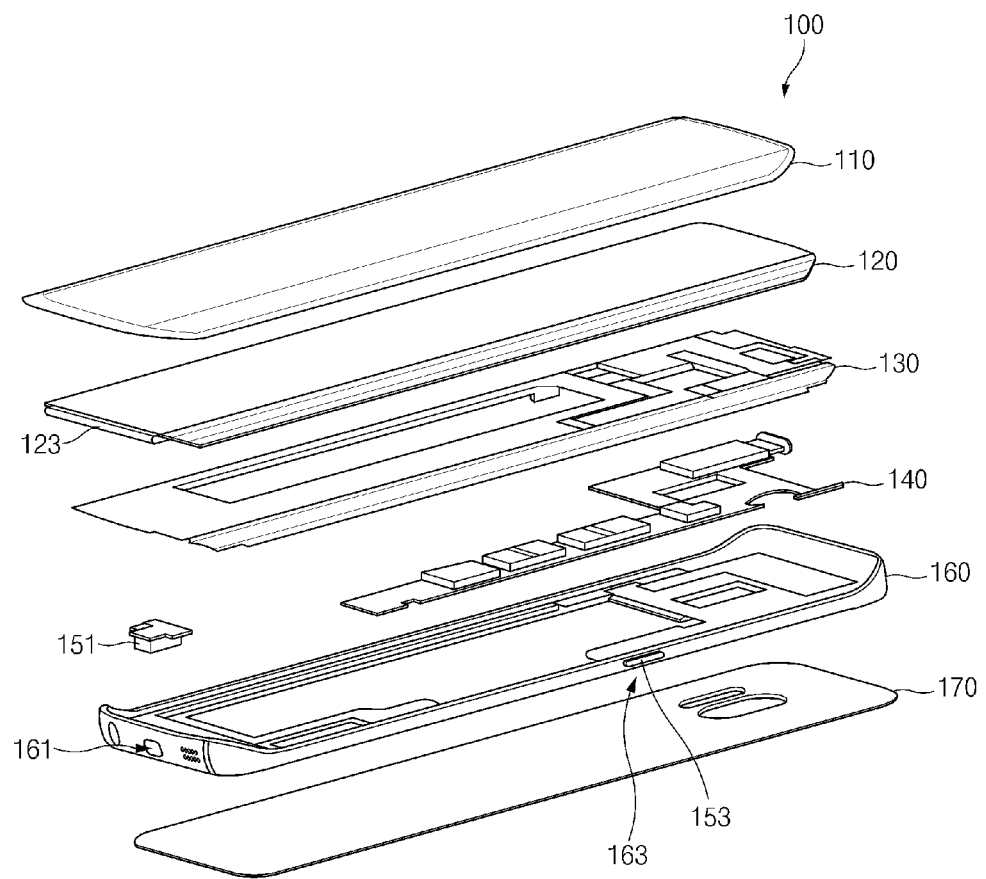
FIG. 1 is an exploded perspective view illustrating an example part of an electronic device according to an example embodiment of the present disclosure.

Hereinafter, various example embodiments of the present disclosure are disclosed and described with reference to the accompanying drawings. However, the present disclosure is not intended to be limited by the various example embodiments of the present disclosure to any specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to the bibliographical meanings, but, are merely used to enable a clear and consistent understanding of the present disclosure. Accordingly, it should be apparent to those skilled in the art that the following description of various example embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even if the terms are defined in the present disclosure, they are not intended to be interpreted as excluding embodiments of the present disclosure.

An electronic device according to various example embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit), or the like, but is not limited thereto.

In various example embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame, or the like, but is not limited thereto.

In other various example embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like), or the like, but is not limited thereto.

According to various example embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like), or the like, but is not limited thereto. An electronic device may be one or more combinations of the above-mentioned devices. An electronic device according to various embodiments of the present disclosure may be a flexible device. An electronic device according to an embodiment of the present disclosure is not limited to the above-mentioned devices, and may include new electronic devices with the development of new technology.

Hereinafter, an electronic device according to various example embodiments of the present disclosure will be described in greater detail with reference to the accompanying drawings. The term "user" used herein may refer to a person who uses an electronic device or may refer to a device (e.g., an artificial intelligence electronic device) that uses an electronic device.

Figure 2:
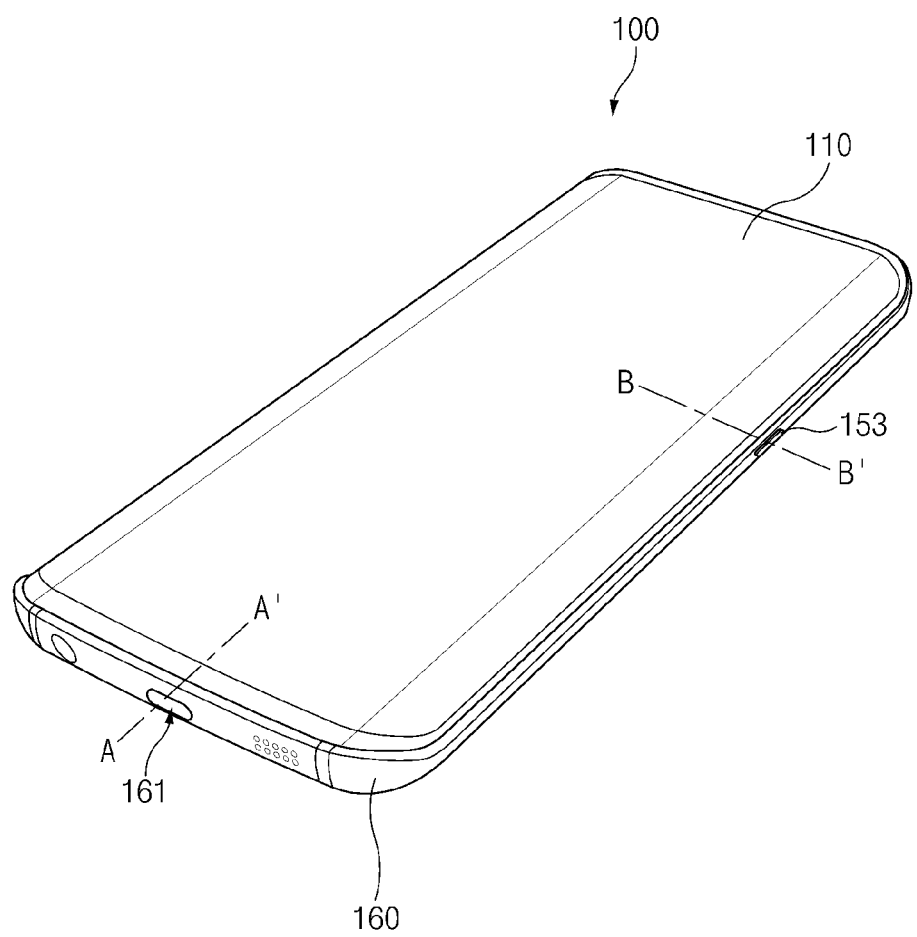
FIG. 2 is a perspective view illustrating an example electronic device according to an example embodiment of the present disclosure.

FIG. 1 is an exploded perspective view illustrating an example part of an electronic device according to an example embodiment of the present disclosure. FIG. 2 is a perspective view illustrating an example electronic device according to an example embodiment of the present disclosure. The electronic device of FIG. 2 is a form in which the elements of the electronic device of FIG. 1 are combined with each other.

Referring to FIGS. 1 and 2, the electronic device 100 may include a front cover 110, a display panel 120, a bracket 130, a printed circuit board 140, a first hardware module 151, a second hardware module 153, a housing 160, and a rear cover 170. According to an example embodiment, the elements may be attached to each other or may be partially spaced apart from each other to be stacked.

The front cover 110 may define an external appearance of the electronic device 100. According to an example embodiment, the front cover 110 may include a transparent material, for example, glass, such that contents, which are output through the display panel 120, may be exposed to the outside. According to various example embodiments, a portion of a peripheral area of the front cover 110 may be curved to define a curved surface. The drawings illustrate a state in which a side surface area of the front cover 110 defines a curved surface.

The display panel 120 may be arranged under the front cover 110, and may display various contents. The display panel 120 may include a polymer layer, a plurality of display elements that are coupled to one surface of the polymer layer, and at least one conductive line that is coupled to the polymer layer and is electrically connected with the plurality of display elements. The polymer layer may comprise a flexible material such that at least a portion (e.g., the bending part 123) may be curved to the rear side. According to an example embodiment, the polymer layer may include, for example, and without limitation, polyimide. The plurality of display elements are arranged on one surface of the polymer layer in a matrix form to define pixels of the display panels 120, and may include a fluorescent material or an organic fluorescent material that may express colors. According to an example embodiment, the plurality of display elements may include organic light emitting diodes (OLEDs). The conductive line may include at least one gate signal line or at least one data signal line. According to an example embodiment, a plurality of gate signal lines and a plurality of data signal lines are arranged in a matrix form, and the plurality of display elements may be arranged adjacent to points where lines cross each other and may be electrically connected with each other.

According to various example embodiments, the display panel 120 may be connected with the display driving circuit. According to an example embodiment, the display driving circuit may be connected with the bending part 123 of the display panel 120. The display driving circuit may be electrically connected with the conductive line. The display driving circuit may include a driver IC that provides a driving signal and an image signal to the display panel 120, or a timing controller (T-con) that controls the driving signal and the image signal. The driver IC may include a gate driver IC that sequentially selects the gate signal lines of the display panel 120 and applies a scan signal (or a driving signal) to the selected gate signal lines, and a data driver IC (or a source driver IC) that applies an image signal to the data signal lines of the display panel 120. According to an example embodiment, if the gate driver IC selects a gate signal line, and applies a scan signal to the selected gate signal line to convert the corresponding display element into an active state, the data driver IC may apply an image signal to the corresponding display element through the data signal line. The timing controller may adjust a transmission time of the signal transmitted to the driver IC to prevent a difference between display times that may occur in a process of outputting the adjusted transmission time on the display panel 120.

The bracket 130 may have a size that is the same as or similar to that of the front cover 110, and may fix and support the display panel 120. According to an example embodiment, at least a portion of the bracket 130 may be surrounded or covered by the bending part 123 of the display panel 120. For example, the remaining parts of the display panel 120, except for the bending part 123, are located on the front panel of the bracket 130, and the bending part 123 of the display panel 120 may be curved to cover and surround one side surface and a portion of a rear surface of the bracket 130. According to an example embodiment, a bonding material may be applied to at least an area of the bracket 130 which the display panel 120 contacts or the at least one area of the bracket 130 may include a bonding layer such that the display panel 120 may be fixed to the bracket 130. In some example embodiments, the front cover 110 may be fixed to the bracket 130 through a bonding member or a screw member.

The printed circuit board 140 may be arranged under the bracket 130, and various electronic components may be mounted on the printed circuit board 140. For example, at least one electronic element and circuit lines may be arranged on the printed circuit board 140, and at least some of them may be electrically connected with each other. The electronic components, for example, may include a processor, a memory, and a communication module (e.g., including communication circuitry). According to various example embodiments, the display driving circuit may be electrically connected with the printed circuit board 140, or may be arranged on the printed circuit board 140. Further, a first hardware module 151 and a second hardware module 153 may be electrically connected with the printed circuit board 140, or may be arranged on the printed circuit board 140. The drawing illustrates a state in which the printed circuit board 140 is integrally formed, but the present disclosure is not limited thereto. According to various example embodiments, a plurality of printed circuit boards 140 may be provided, and at least some of the plurality of printed circuit boards 140 may be electrically connected with each other.

The first hardware module 151 and the second hardware module 153, for example, may include various hardware components, such as, for example, and without limitation, a hardware interface, an audio component, or a physical button, or the like. The hardware interface may include, for example, an interface for hardware communication between the electronic device 100 and an external electronic device, and for example, may include, for example, and without limitation, a USB connector (e.g., a C-type USB connector), an earphone receptacle, or an SIM socket, or the like. The audio component, for example, may include, for example, and without limitation, a microphone, a speaker, or a receiver, or the like. The physical button, for example, may include, for example, and without limitation, a power button, a home button, or a volume button, or the like. The drawing illustrates an example state in which the first hardware module 151 includes a hardware interface, and the second hardware module 153 includes a physical button.

The housing 160 may fix and support the internal components of the electronic device 100. According to an example embodiment, the display panel 120, the bracket 130, and the printed circuit board 140 may be sequentially stacked and may be seated on the housing 160. Further, the first hardware module 151 and the second hardware module 153 may be also seated on the housing 160 to be fixed. The housing 160 may include a front surface, a rear surface, and a side surface, and at least one through-hole (or an interfacing hole) may be formed on or in the side surface. According to an example embodiment, the first hardware module 151 or the second hardware module 153 may be exposed to the outside through the through-hole. The drawing illustrates a state in which the first hardware module 151 is exposed to the outside through a first through-hole 161 and the second hardware module 153 is exposed to the outside through the second through-hole 163.

According to various example embodiments, at least one surface of the housing 160 may comprise a metallic material. According to an example embodiment, a side surface of the housing 160 may include a metal frame. According to various example embodiments, the front cover 110 may be detachably mounted on the housing 160. According to an example embodiment, the front cover 110 may be coupled to the side surface of the housing 160 while covering the front surface of the housing 160.

The rear cover 170 may define a rear external appearance of the electronic device 100. According to various example embodiments, the rear cover 170 may be detachably mounted on the housing 160. According to an example embodiment, the rear cover 170 may be coupled to the side surface of the housing 160 while covering the rear surface of the housing 160.

According to various example embodiments, at least one of the elements of the electronic device 100 may be excluded or at least one other element may be further included. According to an example embodiment, the electronic device 100 may further include a touch panel. The touch panel may be stacked on a rear surface of the front cover 110, and may include a touch sensor that may detect a contact or an approach of a touch object, such as a portion of the user's body or an electronic pen. Further, the electronic device 100 may further include a battery that may supply electric power to the electronic device 100.

Figure 3:
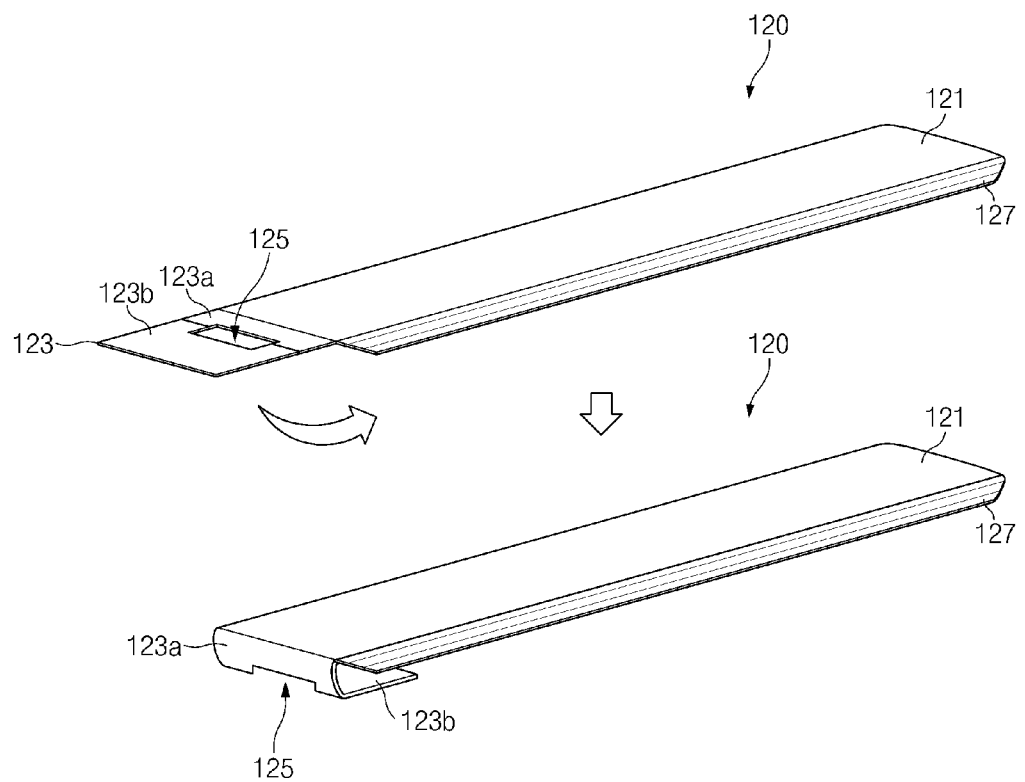
FIG. 3 is a perspective view illustrating an example display panel according to an example embodiment of the present disclosure.
Figure 4:
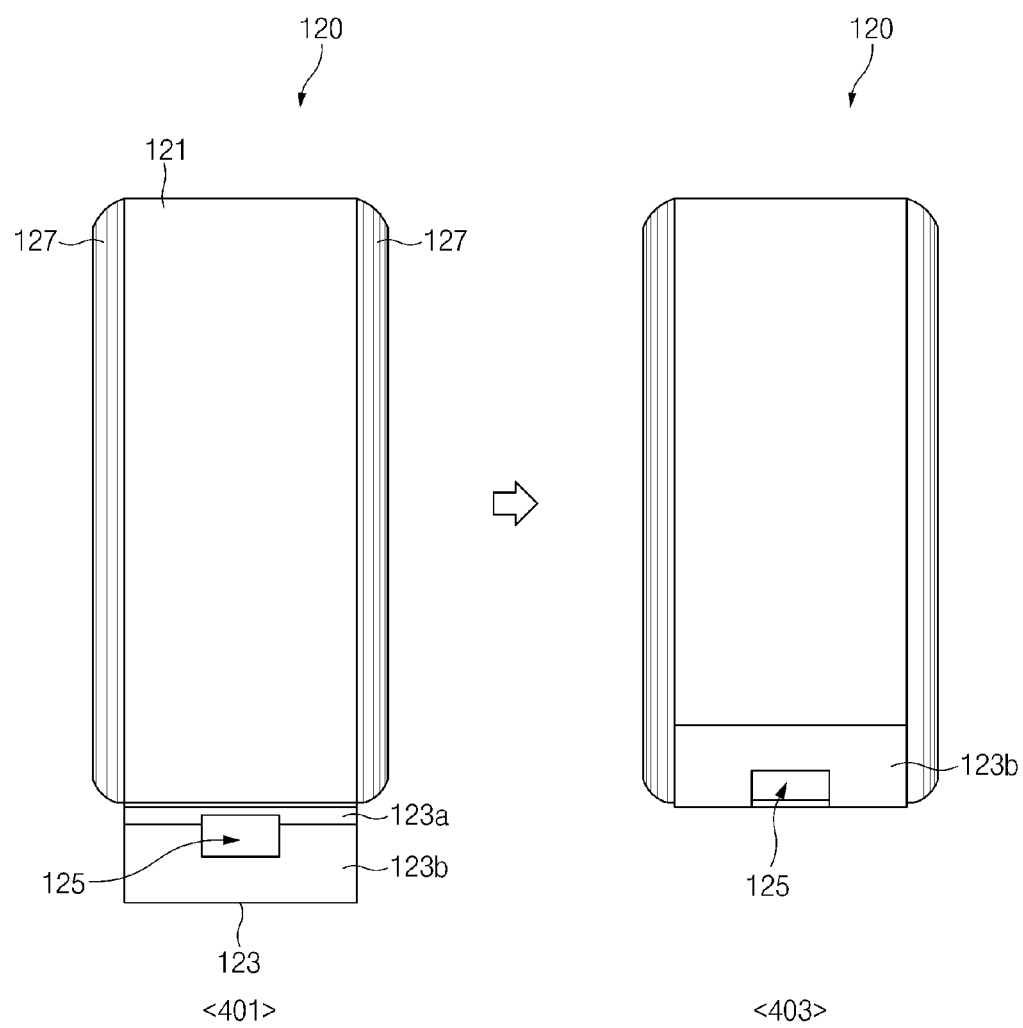
FIG. 4 is a rear view illustrating an example display panel according to an example embodiment of the present disclosure.
Figure 5:
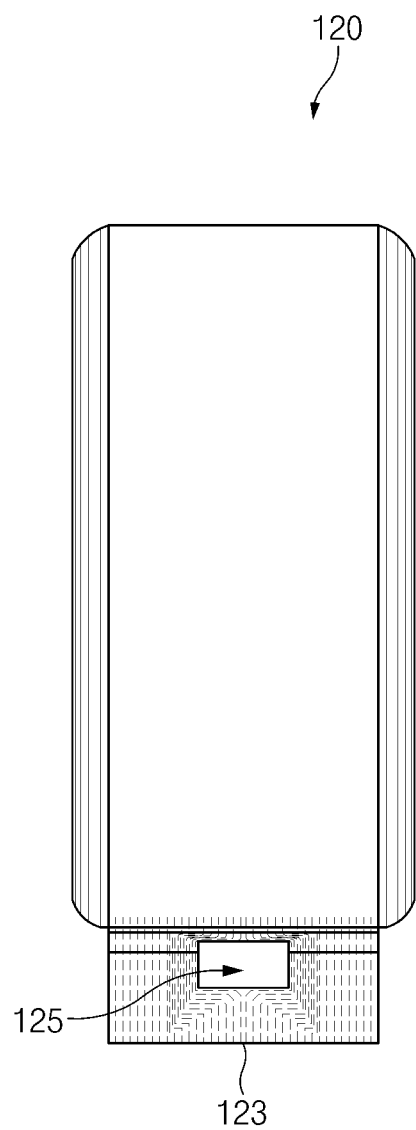
FIG. 5 is a diagram illustrating example signal lines that are formed in a bending part of a display panel according to an example embodiment of the present disclosure.

FIG. 3 is a perspective view illustrating an example display panel according to an example embodiment of the present disclosure. FIG. 4 is a rear view illustrating an example display panel according to an example embodiment of the present disclosure. FIG. 5 illustrates signal lines disposed in a bending part of a display panel according to an example embodiment of the present disclosure. In the following description, the contents that are the same as or similar to or correspond to the above-described contents will be omitted.

Referring to FIGS. 3 to 5, the display panel 120 may include a front surface part 121 that is parallel to a front surface of the housing 160, and a bending part 123 that extends from a peripheral portion of the front surface part 121. According to various example embodiments, the remaining peripheral portions of the front surface part 121, except for a peripheral portion, to which the bending part 123 is connected, may be curved to define curving parts 127. The drawing illustrates an example state in which the curving parts 127 are formed at left and right peripheries of the front surface part 121. According to an example embodiment, the curving parts 127 may define curved surfaces of a specific curvature, and in some example embodiments, may have different curvatures depending on spacing distances from the center of the front surface part 121. However, the present disclosure is not limited thereto. According to various example embodiments, the front surface part 121 may not have a curved surface 127.

The bending part 123 may include a side surface portion 123a that extends from a peripheral portion of the front surface part 121 along at least a portion of the side surface of the housing 160, and a rear surface portion 123b that extends from the side surface portion 123a and is parallel to the rear surface of the housing 160. According to various example embodiments, the side surface portion 123a may be bent from a peripheral portion of the front surface part 121 towards the rear surface portion 123b by an angle that is the same as or similar to a right angle. Further, the side surface portion 123a may be curved in an arc shape from a peripheral portion of the front surface part 121 to the rear surface portion 123b. According to an example embodiment, the side surface portion 123a may define curved surfaces of a specific curvature, and in some example embodiments, may have different curvatures depending on spacing distances from the center of the front surface part 121.

According to various example embodiments, the rear surface portion 123b may extend from the side surface portion 123a, and may be located between the front surface part 121 of the display panel 120 and the rear surface of the housing 160. According to an example embodiment, the rear surface portion 123b may be inserted between the front surface part 121 of the display panel 120 and the rear surface of the housing 160, and may be electrically connected with the display driving circuit.

According to various example embodiments, the display panel 120 may surround a portion of the bracket 130. According to an example embodiment, the front surface part 121 of the display panel 120 may be located on the front surface of the bracket 130, and the bending part 123 of the display panel 120 may surround one side surface and a portion of the rear surface of the bracket 130. For example, the side surface portion 123a of the bending part 123 may cover one side surface of the bracket 130, and the rear surface portion 123b of the bending part 123 may cover a portion of the rear surface of the bracket 130. According to various example embodiments, at least one of a support member or an absorption member may be further arranged between the front surface part 121 of the display panel 120 and the rear surface portion 123b of the bending part 123. The support member may support the front surface 121 or the side surface portion 123a of the bending part 123 to maintain the shape of the front surface 121 or the side surface portion 123a of the bending part 123. According to an example embodiment, a portion of the support member may be attached to the side surface portion 123a to maintain the shape (e.g., a curved shape) of the side surface portion 123a. According to various example embodiments, the support member may be connected with a housing (e.g., the housing 160) or a printed circuit board (e.g., the printed circuit board 140) of an electronic device (e.g., the electronic device 100 of FIG. 1) to fix the display panel 120. The support member may maintain the shape of the display panel 120 and fix the display panel 120 to the interior of the electronic device as well. When a force is applied to the front surface 121 or the side surface portion 123a of the bending part 123, the absorption member may function as an absorber. For example, the absorption member may prevent and/or reduce the display panel 120 from being deformed due to a force generated when a user touches a screen. According to various example embodiments, at least one of the support member or the absorption member may be integrally formed with the bracket 130 or may be separately formed. According to an example embodiment, when the support member is separately formed from the bracket 130, the support member may be attached between the front surface part 121 of the display panel 120 and the rear surface portion 123b of the bending part 123.

According to various example embodiments, the bending part 123 may include at least one opening 125. According to an example embodiment, the opening may pass through a portion of the side surface portion 123a and a portion of the rear side surface portion 123b of the bending part 123. According to various example embodiments, at least one of the hardware modules (e.g., the first hardware module 151 or the second hardware module 153) included in the electronic device 100 may be partially arranged in the opening 125 formed in the bending part 123. For example, a portion of the first hardware module 151 may be located while being inserted into the opening 125. Further, at least one through-hole (e.g., the first-through hole 161) formed on a side surface of the housing 160 and the opening 125 may be at least partially aligned with each other. Accordingly, the hardware module arranged while being inserted into the opening 123 may be exposed to the outside through the through-hole.

According to various example embodiments, the display elements may be coupled to the front surface part 121 of the display panel 120 and a portion of the bending part 123. According to an example embodiment, the display elements may be arranged in the front surface part 121 and the side surface portion 123a of the bending 123. However, the present disclosure is not limited thereto. In some example embodiments, the display elements may be arranged only in the front surface part 121 of the display panel 120. According to various example embodiments, the elements, which are closest to the side surface of the housing 160, of the display elements may be located 0 mm to 3 mm away from the side surface of the housing 160.

According to various example embodiments, one or more signal lines that electrically connect the display elements and the display driving circuit connected with the bending part 123 may be arranged in the display panel 120. The signal lines may comprise a conductive material. According to various example embodiments, the signal lines may arranged in a matrix form on the front surface part 121 of the display panel 120 to be arranged in the display elements arranged in the front surface part 121. According to various example embodiments, some sections of the signal lines may detour in the bending part 123 due to the opening 125. As illustrated in the drawings, the signal lines may detour around the opening 125 so that some signal lines may be concentrated. According to various example embodiments, some of the signal lines may be arranged in a matrix form to be arranged in the display elements arranged in the side surface portion 123a of the bending part 123, and the signal lines that detour due to the opening 125 may be spaced apart from each other by a specific spacing distance not to overlap each other. Further, a deviation of the signal transmission times, which may occur due to the signal lines that detour around the opening 123 may be controlled through a timing controller included in the display driving circuit.

According to various example embodiments, the interval between the signal lines of a section, which cross the opening 125, of the signal lines formed in the bending part 123, may be smaller than the interval of the signal lines of a section, which do not cross the opening 125. Further, the width (or thickness) of the signal lines in the section, which cross the opening 125 may be smaller than the width (or thickness) of the signal lines of the section, which do not cross the opening 125.

According to various example embodiments, a dielectric layer may be formed along a peripheral area of the opening 125. The dielectric layer may reduce a mutual interference between an electrical signal generated by a hardware module (e.g., the first hardware module 151), a portion of which is inserted into the opening 125, and an electrical signal (e.g., an image signal) generated by the display panel 120 or an interference by an electrical signal generated by an external electronic device connected from the outside through a through-hole (e.g., the first through-hole 161).

According to various example embodiments, effective pixels (or display elements) may be arranged along a peripheral area of the opening 125. The effective pixels may emit light to perform a specific function. For example, the effective pixels may emit light at a brightness level (or an intensity of illumination) of a specific level or less, and accordingly, a user may distinguish a location of the USB connector, the earphone receptacle, or the SIM socket more accurately. Further, the effective pixels may emit light at different brightness levels or with colors in specific situations. For example, the brightness levels or colors of the effective pixels may be differently determined depending on a power level of a battery of a USB device, a volume of an earphone, or whether a power button of the electronic device is pressed.

As described above, if the display panel 120 is fixed to the bracket 130 through the bending part 123 of the display panel 120, a non-display area of the front surface part 121 of the display panel 120 may be reduced so that the whole front surface part 121 or an area of the front surface part 121, except for at least a portion of the front surface part 121, may be utilized as a display area. For example, a black matrix layer arranged on the front surface part 121 may be applied only to an area in which the front surface part 121 and the side surface portion 123a of the bending part 123 are connected with each other. In some example embodiments, the black matrix layer may be arranged in an area in which the side surface portion 123a and the rear surface portion 123b of the bending part 123 are connected with each other so that the side surface portion 123a may be utilized as a display area.

Further, because the display panel 120 is fixed to the bracket 130 through the bending part 123 of the display panel 120, the thickness of the display module may be reduced. For example, a thickness (e.g., 3.5 mm) for bending the bending part 123 of the display panel 120 and fixing the bent bending part 123 to the bracket 130 is smaller than a thickness (e.g., 7 to 8 mm) for connecting the display panel 120 to the flexible printed circuit board (FPCB), bending the flexible printed circuit board, and fixing the bent flexible printed circuit board to the bracket 130. This is because it is necessary to increase the thickness of solder when the flexible printed circuit board is connected with the display panel 120.

Figure 6A:
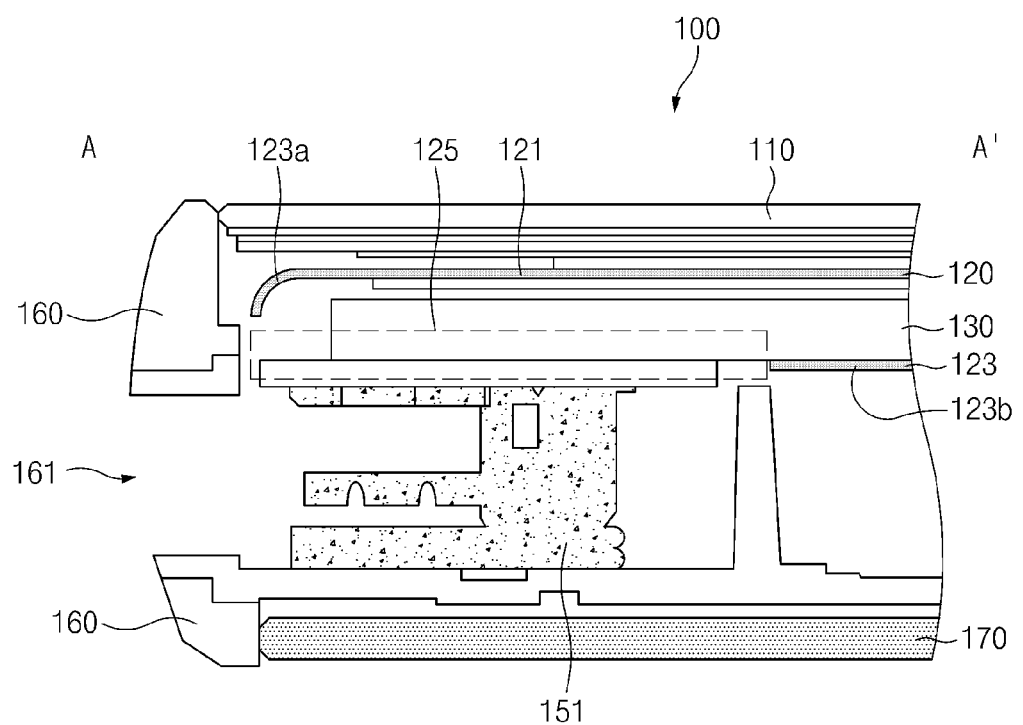
FIG. 6A is a sectional view taken along line A-A' of FIG. 2 according to an example embodiment of the present disclosure.

FIG. 6A is a sectional view taken along line A-A' of FIG. 2 according to an example embodiment of the present disclosure.

Referring to FIG. 6A, the front cover 110 may be located on the most front side of the electronic device 100, and the rear cover 170 may be located on the most rear side of the electronic device 100. Further, the front cover 110 may be coupled to the side surface of the housing 160 while the front surface of the housing 160 is covered, and the rear cover 170 may be coupled to the side surface of the housing 160 while the rear surface of the housing 160 is covered.

The display panel 120, the bracket 130, and the hardware module (e.g., the first hardware module 151) may be seated on and fixed to the housing 160, and although not illustrated, the printed circuit board 140 may be seated on and fixed to the housing 160. The front surface part 121 of the display panel 120 may be located on the front surface of the bracket 130, and the bending part 123 may be bent to cover the side surface and a portion of the rear surface of the bracket 130. The drawing illustrates a state in which the bending part 123 is curved at a specific curvature, but the present disclosure is not limited thereto. In some example embodiments, the bending part 123 may be bent at different curvatures depending on the spacing distances from the front surface part 121 of the display panel 120.

The bending part 123 of the display panel 120 may include at least one opening 125. According to an example embodiment, the opening 125 may pass through a portion of the side surface portion 123a and a portion of the rear side surface portion 123b of the bending part 123. Further, a portion of the hardware module (e.g., the first hardware module 151) may be inserted into the opening 125 formed in the bending part 123.

According to various embodiments, the opening 125 formed in the bending part 123 may be aligned with the through-hole (e.g., the first through-hole 161) formed on the side surface of the housing 160. Through this, the hardware module arranged while a portion of the hardware module is inserted into the opening 125 may be exposed to the outside through the through-hole formed in the housing 160. The drawing illustrates a state in which an upper portion of the first hardware module 151 is inserted into the opening 125 of the bending part 123 and a side of the first hardware module 151 is exposed to the outside through the through-hole formed in the housing 160. The hardware module, for example, may include, for example, and without limitation, a hardware interface, an audio component, or a physical button, or the like.

Figure 6B:
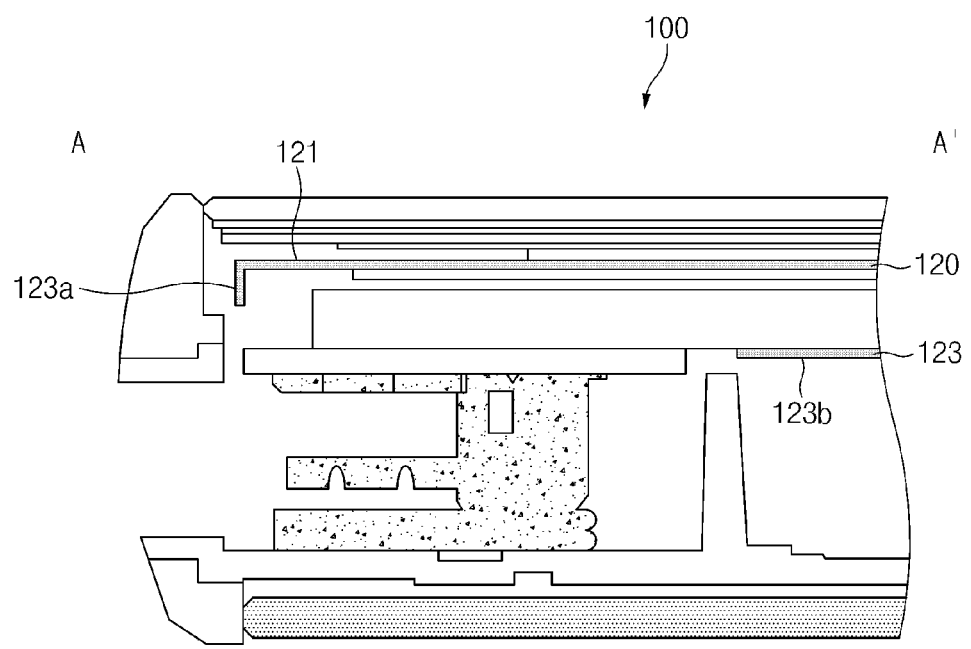
FIG. 6B is a sectional view taken along line A-A' of FIG. 2 according to another example embodiment of the present disclosure.

FIG. 6B is a view taken along line A-A' of FIG. 2 according to another example embodiment of the present disclosure.

According to various embodiments, the bending part 123 of the display panel 120 also may be formed in a curved shape as illustrated in FIG. 6A, and may be bent from a peripheral portion of the front surface part 121 towards the rear surface portion 123b at an angle that is the same as or similar to a right angle. According to an example embodiment, the side surface portion 123a of the bending part 123 may be bent from the front surface part 121 along the side surface of the bracket 130 at a right angle, and the rear surface portion 123b may be bent from the side surface portion 123a along the rear surface of the bracket 130 at a right angle.

Figure 7:
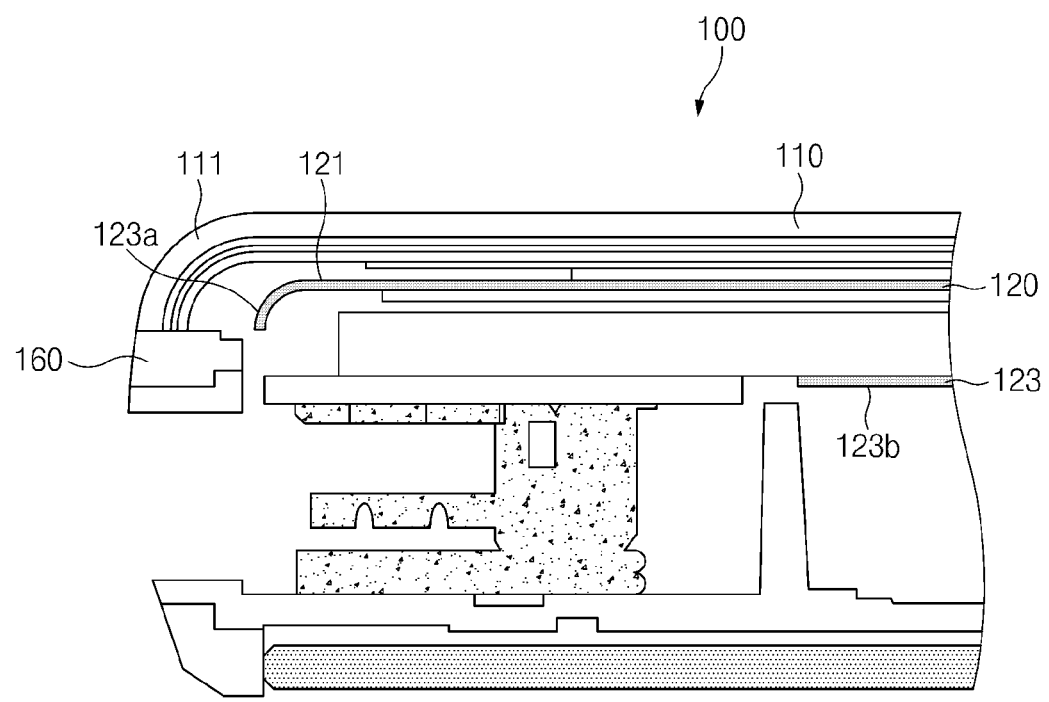
FIG. 7 is a sectional view illustrating an example portion of a curved display according to an example embodiment of the present disclosure.

FIG. 7 is a sectional view illustrating an example portion of a curved display according to an example embodiment of the present disclosure.

According to various example embodiments, the electronic device 100 may include a curved display. For example, a peripheral portion 111 of the front cover 110 may be curved rearwards to define a curved surface, and a peripheral portion of the display panel 120 also may define a curved surface along the curved surface of the front cover 110.

Referring to FIG. 7, a peripheral area 111 of the front cover 110 of the electronic device 100 may define a curved surface. According to an example embodiment, the front cover 110 may have a substantially flat plate shape, and a portion of the peripheral area 111 may have a specific curvature or may have different curvatures depending on spacing distances form a flat surface. The drawings illustrate a state in which a peripheral area 111 of a lower end of the front cover 119 defines a curved surface. However, the present disclosure is not limited thereto. In some example embodiments, at least one of an upper end or a peripheral area of the left and right sides of the front cover 110 may define a curved surface.

According to various example embodiments, when a portion of the peripheral area 111 of the front cover 110 defines a curved surface, the height of a side surface of the housing 160, to which the front cover 110 is coupled, may be lower than in the case the peripheral area 111 of the front cover 110 does not define a curved surface.

According to various example embodiments, the bending part 123 of the display panel 120 also may define a curved surface at a curvature that is the same or similar curvatures along the curved surface defined in the peripheral area 111 of the front cover 110. According to an example embodiment, the side surface portion 123a of the bending part 123 may define a curvature at a curvature that is the same or similar to the curvature defined in the peripheral area 111 of the front cover 110.

According to various example embodiments, the peripheral area 111 of the front cover 110 that defines a curvature may include a transparent material, and contents output through the display panel 120 may be exposed to the outside. For example, an image may be output through the display elements arranged at the side surface portion 123a of the bending part 123, and an image may be exposed to the outside through the transparent material of the peripheral area 111.

Figure 8:
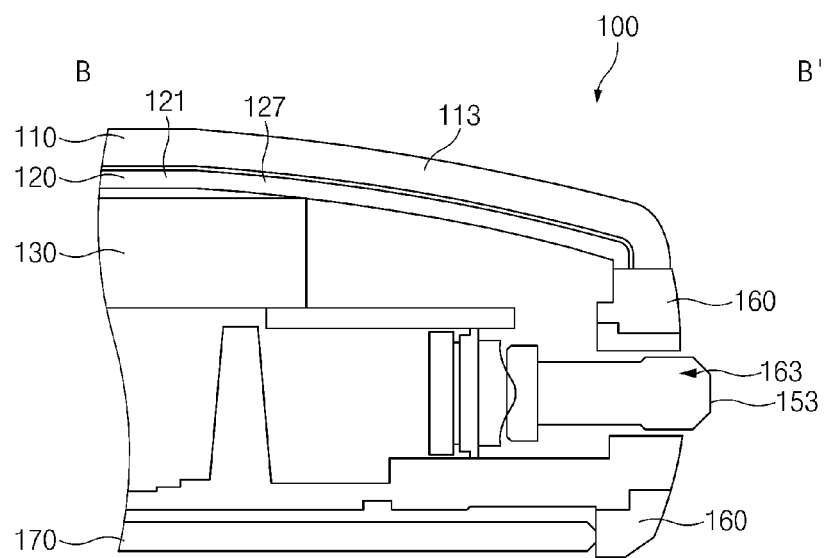
FIG. 8 is a sectional view taken along line B-B' of FIG. 2 according to an example embodiment of the present disclosure.

FIG. 8 is a sectional view taken along line B-B' of FIG. 2 according to an example embodiment of the present disclosure.

According to various example embodiments, the left and right peripheral areas 113 of the front cover 110 of the electronic device 100 may define a curved surface. According to an example embodiment, when curved surfaces are defined in the left and right peripheral areas 113 of the front cover 110, left and right peripheral portions of the front surface part 121 of the display panel 120 may be curved to define a curving part 127. However, the present disclosure is not limited thereto. Although not illustrated, in some example embodiments, when the left and right peripheral areas 113 of the front cover 110 define curved surfaces, a bending part (e.g., the bending part 123) may extend from the left and right peripheral portions of the front surface part 121 of the display panel 120, and the side surface portion (e.g., the side surface portion 123a) of the bending part may define a curved surface at a curvature that is the same as or similar to that of the curved surfaces defined in the left and right peripheral areas 113 of the front cover 110. The drawing illustrates a state in which the left and right peripheral portions of the front surface part 121 of the display panel 120 are curved to define a curving part 127.

Referring to FIG. 8, the left and right peripheral areas 113 of the front cover 110 may define curved surfaces, and may be coupled to the side surface of the housing 160. The drawing illustrates an example state in which the curved surfaces defined in the peripheral areas 113 are curved at different curvatures depending on the spacing distances from the center of the front cover 110. For example, the curved surface may have a relatively small curvature in an area that is close to the center of the front cover 110, and may have a relatively large curvature in an area that is adjacent to a point at which the front cover 110 is coupled to the side surface of the housing 160.

According to various example embodiments, a through-hole (e.g., the second through-hole 163) may be formed on at least one of the left and right side surfaces of the housing 160, and a hardware module (e.g., the second hardware module 153) may be exposed to the outside through the through-hole. The drawing illustrates an example state in which the second hardware module 153 including a physical button is exposed to the outside through the second through-hole 163 defined on a side surface of the housing 160.

According to various example embodiments, bending parts (e.g., the bending part 123) that extend from the left and right peripheral portions of the front surface part 121 of the display panel 120 along the curved surfaces defined in the left and right peripheral areas 113 of the front cover 110 defines curved surfaces, a portion of the hardware module may be inserted into an opening (e.g., the opening 125) defined in the bending parts. Further, a portion of the opening formed in the bending part may be aligned with the through-hole formed on the side surface of the housing 160, the hardware module, a portion of which is inserted into the opening, may be exposed to the outside through the through-hole. Although not illustrated, when the bending parts that extend from the left and right peripheral portions of the front surface part 121 of the display panel 120 along the curved surfaces defined in the left and right peripheral areas 113 of the front cover 110 defines curved surfaces, the rear surface portions (e.g., the rear surface portion 123b) of the bending parts may cover a portion of the rear surface of the bracket 130.

Figure 9:
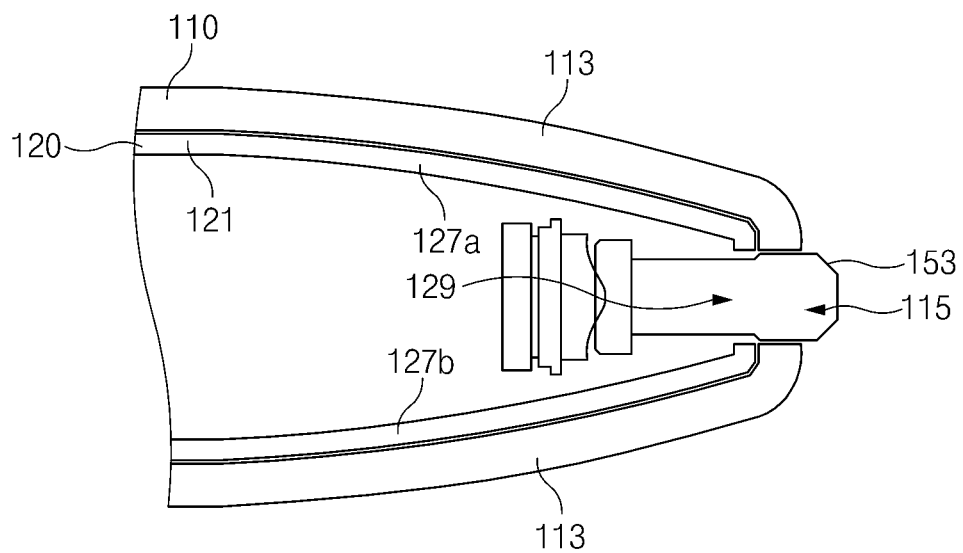
FIG. 9 is a sectional view illustrating an example portion of a wrap-around display according to an example embodiment of the present disclosure.

FIG. 9 is a sectional view illustrating an example portion of a wrap-around display according to an example embodiment of the present disclosure.

According to various example embodiments, the electronic device 100 may include a wrap-around display. For example, the peripheral area 113 of the front cover 110 may be curved rearwards to define a curved surface, and may be connected with the rear cover 170. The drawing illustrates a state in which the left and right peripheral areas 113 of the front cover 110 are bent rearwards and are connected with the rear cover 170

Referring to FIG. 9, the left and right peripheral areas 113 of the front cover 110 may define curved surfaces, and may be connected with the rear cover 170. In this example, although not illustrated, the housing 160 may be arranged in a cavity that is defined by the front cover 110 and the rear cover 170.

According to various example embodiments, a through-hole 115 may be formed at a portion of the left and right peripheral areas 113 of the front cover 110. Accordingly, a hardware module (e.g., the second hardware module 153) seated on the housing may be exposed to the outside through a through-hole 115. The drawing illustrates an example state in which the second hardware module 153 including a physical button is exposed to the outside through the through-holes 115 defined in the left and right peripheral areas 113 of the front cover 110.

According to various example embodiments, the display panel 120 may be arranged under the front cover 110 and partially on the rear cover 170. According to an example embodiment, the front surface part 121 of the display panel 120 may be arranged under the front cover 110, and the curving part 127, a portion of the left and right peripheries of the front surface part 121 is bent to define a curved surface may be arranged under the left and right peripheral areas 113 of the front cover 110 and partially on the rear cover 170. The drawing illustrates a state in which the curving part 127 defines a first curved area 127a above the through-hole 115, and a second curved area 127b is formed below the through-hole 115. According to various example embodiments, the first curved area 127a and the second curved area 127b may have the same curvature, or may have different curvatures. Further, an opening 129 may be formed at a portion of the curving part 127 at a location that is aligned with the through holes 115 defined in the left and right peripheral areas 113 of the front cover 110.

According to various example embodiments, the front surface part 121 of the display panel 120 may be arranged under the front cover 110, and the bending part 123 that extends from the front surface part 121 may be arranged under the left and right peripheral areas 113 of the front cover 110 and partially on the rear cover 170. According to an example embodiment, the side surface portions 123a of the bending part 123 may be arranged at lower portions of the left and right peripheral areas 113 of the front cover 110, and the rear surface portion 123b of the bending part 123 may be arranged at an upper portion of the rear cover 170. Further, the opening 125 formed in the bending part 123 may be aligned with the through-holes 115 formed in the left and right peripheral areas 113 of the front cover 110.

According to various example embodiments, in the electronic device 100, the front cover 110 may be coupled to the display panel 120 to cover the display panel 120, and the bracket 130 may support and fix the display panel 120. In this case, the bending part 123 of the display panel 120 may be assembled to surround one side surface and a portion of a rear surface of the bracket 130. Further, the printed circuit board 140 may be coupled to a lower layer of the bracket 130, and at least one of the first hardware module 151 or the second hardware module 153 may be seated in the opening 125 formed in the bending part 123. For example, at least one of the first hardware module 151 or the second hardware module 153 may be inserted into and fixed to the opening 125 formed in the bending part 123. At least some of the display panel 120, the printed circuit board 140, the first hardware module 151, and the second hardware module 153 may be electrically connected with each other. Further, the front cover 110, the display panel 120, the bracket 130, the printed circuit board 140, the first hardware module 151, and the second hardware module 153, some of which are stacked to be coupled, may be seated on and coupled to the housing 160. According to an example embodiment, the first hardware module 151 or the second hardware module 153 may be exposed to the outside through the through-hole formed on one surface of the housing 160. For example, as the first through-hole 161 and the opening 125 are at least partially aligned with each other, the first hardware module 151 may be exposed to the outside through the first through-hole 161. Further, the second hardware module 153 may be exposed to the outside through the second through-hole 163. According to various example embodiments, the rear cover 170 may be coupled to the housing 160 while covering the rear surface of the housing 160.

Figure 10:
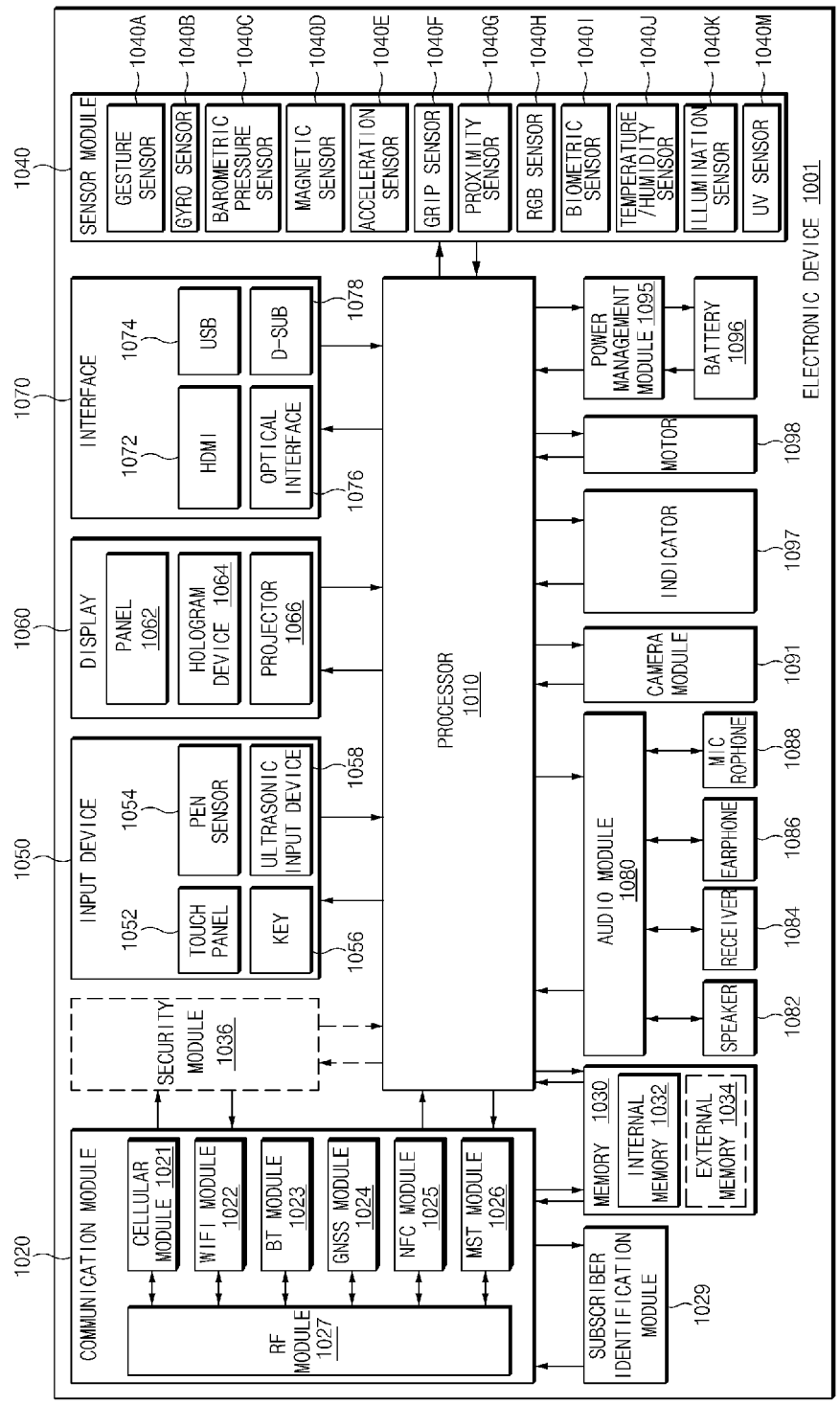
FIG. 10 is a block diagram illustrating an example configuration of an electronic device according to an example embodiment of the present disclosure.

FIG. 10 is a block diagram illustrating an example configuration of an electronic device according to an example embodiment of the present disclosure.

Referring to FIG. 10, the electronic device 1001 may include one or more processors 1010 (e.g., application processors (APs)), a communication module (e.g., including communication circuitry) 1020, a subscriber identification module (SIM) 1029, a memory 1030, a security module 1036, a sensor module 1040, an input device (e.g., including input circuitry) 1050, a display 1060, an interface (e.g., including interface circuitry) 1070, an audio module 1080, a camera module 1091, a power management module 1095, a battery 1096, an indicator 1097, and a motor 1098.

The processor 1010 may include various processing circuitry to drive, for example, an operating system (OS) or an application program to control a plurality of hardware or software components connected thereto and may process and compute a variety of data. The processor 1010 may be implemented with, for example, a system on chip (SoC). According to an embodiment of the present disclosure, the processor 1010 may include a graphic processing unit (GPU) (not shown) and/or an image signal processor (not shown). The processor 1010 may include at least some (e.g., a cellular module 1021) of the components shown in FIG. 10. The processor 1010 may load a command or data received from at least one of other components (e.g., a non-volatile memory) into a volatile memory to process the data and may store various data in a non-volatile memory.

The communication module 1020 may include various communication circuitry, such as, for example, and without limitation, the cellular module 1021, a wireless-fidelity (Wi-Fi) module 1022, a Bluetooth (BT) module 1023, a global navigation satellite system (GNSS) module 1024 (e.g., a GPS module, a Glonass module, a Beidou module, or a Galileo module), a near field communication (NFC) module 1025, an MST module 1026, and a radio frequency (RF) module 1027.

The cellular module 1021 may provide, for example, a voice call service, a video call service, a text message service, or an Internet service, and the like through a communication network. According to an embodiment of the present disclosure, the cellular module 1021 may identify and authenticate the electronic device 1001 in a communication network using the SIM 1029 (e.g., a SIM card). According to an embodiment of the present disclosure, the cellular module 1021 may perform at least part of functions which may be provided by the processor 1010. According to an embodiment of the present disclosure, the cellular module 1021 may include a communication processor (CP).

The Wi-Fi module 1022, the BT module 1023, the GNSS module 1024, the NFC module 1025, or the MST module 1026 may include, for example, a processor for processing data transmitted and received through the corresponding module. According to various embodiments of the present disclosure, at least some (e.g., two or more) of the cellular module 1021, the Wi-Fi module 1022, the BT module 1023, the GNSS module 1024, the NFC module 1025, or the MST module 1026 may be included in one integrated chip (IC) or one IC package.

The RF module 1027 may transmit and receive, for example, a communication signal (e.g., an RF signal). Though not shown, the RF module 1027 may include, for example, a transceiver, a power amplifier module (PAM), a frequency filter, or a low noise amplifier (LNA), or an antenna, and the like. According to another embodiment of the present disclosure, at least one of the cellular module 1021, the Wi-Fi module 1022, the BT module 1023, the GNSS module 1024, the NFC module 1025, or the MST module 1026 may transmit and receive an RF signal through a separate RF module.

The SIM 1029 may include, for example, a card which includes a SIM and/or an embedded SIM. The SIM 1029 may include unique identification information (e.g., an integrated circuit card identifier (ICCID)) or subscriber information (e.g., an international mobile subscriber identity (IMSI)).

The memory 1030 may include, for example, an embedded memory 1032 and/or an external memory 1034. The embedded memory 1032 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 1034 may include a flash drive, for example, a compact flash (CF), a secure digital (SD), a micro-SD, a mini-SD, an extreme digital (xD), a multimedia car (MMC), or a memory stick, and the like. The external memory 1034 may operatively and/or physically connect with the electronic device 1001 through various interfaces.

The security module 1036 may include various circuitry and/or program modules, such as, for example, and without limitation, a module which has a relatively higher secure level than the memory 1030 and may be a circuit which stores secure data and guarantees a protected execution environment. The security module 1036 may be implemented with a separate circuit and may include a separate processor. The security module 1036 may include, for example, an embedded secure element (eSE) which is present in a removable smart chip or a removable SD card or is embedded in a fixed chip of the electronic device 1001. Also, the security module 1036 may be driven by an OS different from the OS of the electronic device 1001. For example, the security module 1036 may operate based on a java card open platform (JCOP) OS.

The sensor module 1040 may measure, for example, a physical quantity or may detect an operation state of the electronic device 1001, and may convert the measured or detected information to an electrical signal. The sensor module 1040 may include at least one of, for example, a gesture sensor 1040A, a gyro sensor 1040B, a barometric pressure sensor 1040C, a magnetic sensor 1040D, an acceleration sensor 1040E, a grip sensor 1040F, a proximity sensor 1040G a color sensor 1040H (e.g., red, green, blue (RGB) sensor), a biometric sensor 1040I, a temperature/humidity sensor 1040J, an illumination sensor 1040K, or an ultraviolet (UV) sensor 1040M. Additionally or alternatively, the sensor module 1040 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 1040 may further include a control circuit for controlling at least one or more sensors included therein. According to various embodiments of the present disclosure, the electronic device 1001 may further include a processor configured to control the sensor module 1040, as part of the processor 1010 or to be independent of the processor 1010. While the processor 1010 is in a sleep state, the electronic device 1001 may control the sensor module 1040.

The input device 1050 may include various input circuitry, such as, for example, and without limitation, a touch panel 1052, a (digital) pen sensor 1054, a key 1056, or an ultrasonic input device 1058. The touch panel 1052 may use at least one of, for example, a capacitive type, a resistive type, an infrared type, or an ultrasonic type. Also, the touch panel 1052 may further include a control circuit. The touch panel 1052 may further include a tactile layer and may provide a tactile reaction to a user.

The (digital) pen sensor 1054 may be, for example, part of the touch panel 1052 or may include a separate sheet for recognition. The key 1056 may include, for example, a physical button, an optical key, or a keypad. The ultrasonic input device 1058 may allow the electronic device 1001 to detect a sound wave using a microphone (e.g., a microphone 1088) and to verify data through an input tool generating an ultrasonic signal.

The display 1060 may include a panel 1062, a hologram device 1064, or a projector 1066. The panel 1062 may include the same or similar configuration to the display 77760. The panel 1062 may be implemented to be, for example, flexible, transparent, or wearable. The panel 1062 and the touch panel 1052 may be integrated into one module. The hologram device 1064 may show a stereoscopic image in a space using interference of light. The projector 1066 may project light onto a screen to display an image. The screen may be positioned, for example, inside or outside the electronic device 1001. According to an embodiment of the present disclosure, the display 1060 may further include a control circuit for controlling the panel 1062, the hologram device 1064, or the projector 1066.

The interface 1070 may include various interface circuitry, such as, for example, and without limitation, a high-definition multimedia interface (HDMI) 1072, a universal serial bus (USB) 1074, an optical interface 1076, or a D-subminiature 1078. Additionally or alternatively, the interface 1070 may include, for example, a mobile high definition link (MHL) interface, an SD card/multimedia card (MMC) interface, or an infrared data association (IrDA) standard interface.

The audio module 1080 may convert a sound and an electric signal in dual directions. The audio module 1080 may process sound information input or output through, for example, a speaker 1082, a receiver 1084, an earphone 1086, or the microphone 1088, and the like.

The camera module 1091 may be a device which captures a still image and a moving image. According to an embodiment of the present disclosure, the camera module 1091 may include one or more image sensors (not shown) (e.g., a front sensor or a rear sensor), a lens (not shown), an image signal processor (ISP) (not shown), or a flash (not shown) (e.g., an LED or a xenon lamp).

The power management module 1095 may manage, for example, power of the electronic device 1001. According to an embodiment of the present disclosure, though not shown, the power management module 1095 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 1096 and voltage, current, or temperature thereof while the battery 1096 is charged. The battery 1096 may include, for example, a rechargeable battery or a solar battery.

The indicator 1097 may display a specific state of the electronic device 1001 or part (e.g., the processor 1010) thereof, for example, a booting state, a message state, or a charging state, and the like. The motor 1098 may convert an electric signal into mechanical vibration and may generate vibration or a haptic effect, and the like. Though not shown, the electronic device 1001 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a MediaFLO™ standard, and the like.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Also, some of the elements of the electronic device according to various embodiments of the present disclosure may be combined with each other to form one entity, thereby making it possible to perform the functions of the corresponding elements in the same manner as before the combination.

Figure 11:
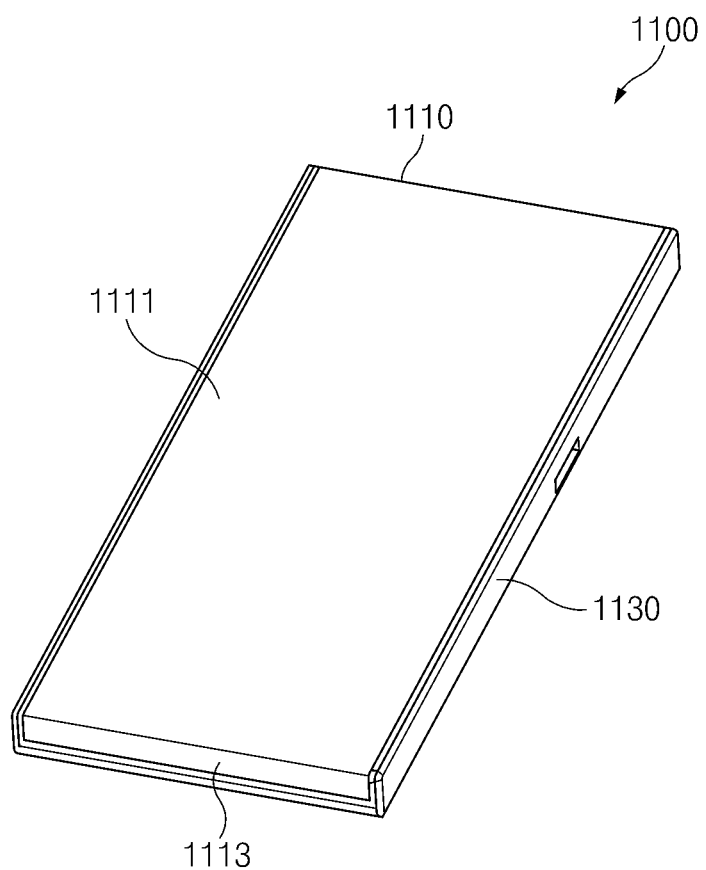
FIG. 11 is a perspective view illustrating another example form of an electronic device according to an example embodiment of the present disclosure.

FIG. 11 is a perspective view illustrating an example of another form of an electronic device according to an example embodiment of the present disclosure.

Referring to FIG. 11, a display 1110 of the electronic device 1100 may extend to at least one of side surfaces, as well as a front surface of the electronic device 1100. According to an example embodiment, the display 1110 may include a front surface part 1111, and a lower side surface part 1113 that extends from a lower end of the front surface part 1111. However, the present disclosure is not limited thereto. In some embodiments, an upper side surface part that extends form an upper end of the front surface part 1111 may be further provided.

According to various example embodiments, when the display 1110 extends to at least one of the side surfaces of the electronic device 1100, the shape of the housing 1130 of the electronic device 1100 may be differently determined. For example, when the display 1110 includes the lower side surface part 1113, the housing 1130 may not have a lower side surface.

Although the front surface part 1111 and the lower side surface part 1113 are formed based on the shape of the display 1110 in the above description, the display 1110 may correspond to the display panel 120 described with reference to FIGS. 1 to 9 and the front surface part 1111 and the lower side surface part 1113 may correspond to the front surface part 121 and the side surface portion 123a of the display panel 120.

Figure 12A:
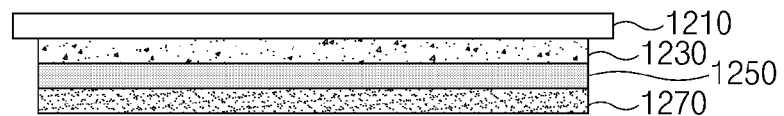
FIG. 12A is a sectional view illustrating an example electronic device that includes a display panel according to an example embodiment of the present disclosure.
Figure 12B:
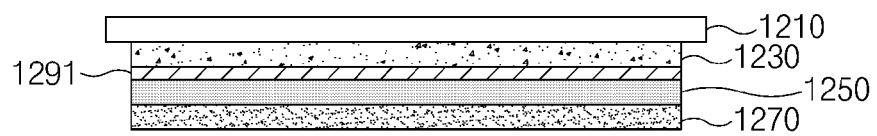
FIG. 12B is a sectional view illustrating an example electronic device in which a touch panel and a front cover are integrally formed, according to an example embodiment of the present disclosure.
Figure 12C:
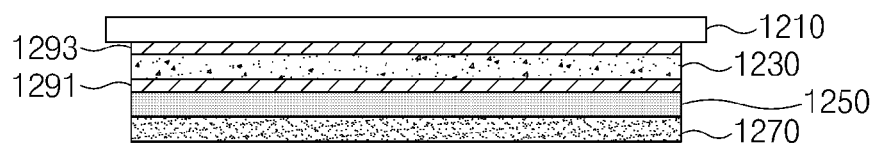
FIG. 12C is a sectional view illustrating an example electronic device in which a touch panel is attached to a front cover, according to an example embodiment of the present disclosure.
Figure 12D:
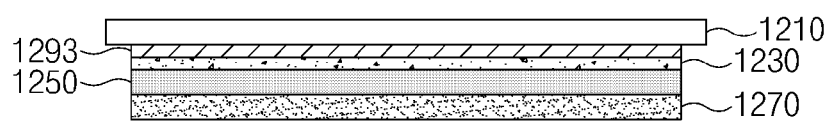
FIG. 12D is a sectional view illustrating an example electronic device in which a touch panel is provided in a front cover in an on-cell form, according to an example embodiment of the present disclosure.
Figure 12E:
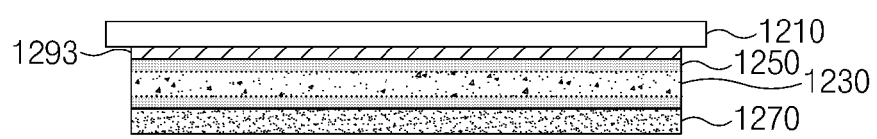
FIG. 12E is a sectional view illustrating an example electronic device in which a touch panel is provided in a front cover in an in-cell form, according to an example embodiment of the present disclosure.

FIG. 12A is a sectional view illustrating an example electronic device that includes a display panel according to an example embodiment of the present disclosure. FIG. 12B is a sectional view illustrating an example electronic device in which a touch panel and a front cover are integrally formed, according to an example embodiment of the present disclosure. FIG. 12C is a sectional view illustrating an example electronic device in which a touch panel is attached to a front cover, according to an example embodiment of the present disclosure. FIG. 12D is a sectional view illustrating an example electronic device in which a touch panel is provided in a front cover in an on-cell form, according to an example embodiment of the present disclosure. FIG. 12E is a sectional view illustrating an example electronic device in which a touch panel is provided in a front cover in an in-cell form, according to an example embodiment of the present disclosure.

Referring to FIGS. 12A to 12E, a front cover 1210 (e.g., the front cover 110) may define an external appearance of a front surface of an electronic device (e.g., the electronic device 100). A touch panel 1230 may be stacked under the front cover 1210. The touch panel 1230 may be formed of a transparent conductive material (e.g., an ITO electrode). However, the present disclosure is not limited thereto. The touch panel 1230 may have patterns of an opaque metallic material, which are so small that they cannot be viewed by the eyes of a person. According to various example embodiments, the touch panel 1230 may be provided in a glass type in which an electrode is formed in a glass substrate, a film type in which an electrode is formed in plastic or film, or an embedding type in which an electrode is integrated with a display panel 1250 (e.g., the display panel 120). The glass type and the film type may include an external (or add-on) type that requires a separate layer between the display panel 1250 and the front cover 1210, and an integral type in which an electrode is implemented in the front cover 1210. FIG. 12B illustrates an integral type, and FIG. 12C illustrates an add-on type. Further, FIGS. 12D and 12E illustrate an embedding type, and FIG. 12E illustrates an on-cell type.

Referring to FIG. 12, the touch panel 1230 may be integrally formed with the front cover 1210. According to an embodiment, a Tx electrode and an Rx electrode are formed on the front cover 1210 with two ITO electrode layers and an overlapping area of the Tx electrode and the Rx electrode may be separated by an insulation layer. However, the present disclosure is not limited thereto. In some embodiments, a Tx electrode and an Rx electrode may be formed on the front cover 1210 with one ITO electrode layer and an insulation layer may be omitted. According to various example embodiments, the display panel 1250 may be attached to the touch panel 1230 under the touch panel 1230 through a first bonding member 1291 as illustrated in FIG. 12B).

Referring to FIG. 12, the touch panel 1230 may be inserted between the front cover 1210 and the display panel 1250. According to various example embodiments, the touch panel 1230 may be provided in a glass type or a film type. As illustrated in the drawing, the touch panel 1230 may be attached to the display panel 1250 through the first bonding member 1291, and may be attached to the front cover 1210 through the second bonding member 1293 (as illustrated in FIG. 12C).

Referring to FIG. 12D, the touch panel 1230 may be directly implemented on the display panel 1250. According to an embodiment, an ITO electrode may be formed in the upper end glass of the display panel 1250. Further, the display panel 1250 having the touch panel 1230 may be attached to the front cover 1210 through the second bonding member 1293.

Referring to FIG. 12E, the touch panel 1230 may be formed in the interior of the display panel 1250. According to an embodiment, an ITO electrode may be formed in a thin film transistor (TFT) of the display panel 1250. Further, the display panel 1250 having the touch panel 1230 therein may be attached to the front cover 1210 through the second bonding member 1293.

According to various example embodiments, a pressure sensor 1270 may be attached under the display panel 1250. According to various example embodiments, the pressure sensor 1270 may be formed in the same layer as the touch panel 1230, and in some embodiments, may be stacked on or under the touch panel to be formed on the display panel 1250. According to various example embodiments, a digitizer may be formed under the pressure sensor 1270. The digitizer may detect an approach or a contact of an electronic pen (e.g., a stylus) that supports an electromagnetic resonance (EMR) type. According to an example embodiment, the digitizer may include a conductive circuit pattern that may detect an external electronic force. For example, the digitizer may detect an electromagnetic force that is emitted from the stylus based on the conductive circuit pattern, and may help determine a point at which the detected electromagnetic force is highest as a touch coordinate. In some embodiments, the pressure sensor 1270 may replace the function of the digitizer. For example, the pressure sensor 1270 may detect a pressure that is generated when it is pressed by a touch object (e.g., an electronic pen or a portion of the user's body) and help determine a point at which the detected pressure is highest as a touch coordinate.

As described above, according to various example embodiments, an electronic device may include a housing that comprises a first surface that faces a first direction, a second surface that faces a second direction opposite to the first direction, and a side surface that surrounds at least a portion of a space between the first surface and the second surface, the housing having at least one through-hole formed on the side surface thereof, a display panel comprising a flexible polymer layer that comprises a first part parallel to the first surface, a second part extending from a peripheral portion of the first part along at least a portion of the side surface, and a third part extending from the second part and is inserted between the first part and the second surface of the housing, the polymer layer having at least one opening that passes through a portion of the second part of the flexible polymer layer and a portion of the third part of the flexible polymer layer, a plurality of display elements coupled to a surface of the first part of the polymer layer, which faces the first direction, a display driving circuit connected with the third part, and at least one conductive line coupled to the polymer layer, extends along the second part, and is electrically connected with the display elements and the display drive circuit, and is arranged around the opening, the through-hole and the opening being at least partially aligned with each other.

According to various example embodiments, the polymer layer may comprise polyimide.

According to various example embodiments, the plurality of display elements may include organic light emitting diodes.

According to various example embodiments, the electronic device may further include a connector that is arranged at least partially in the through-hole and the opening.

According to various example embodiments, the connector may include a C-type USB connector.

According to various example embodiments, the electronic device may further include an earphone receptacle that is arranged at least partially in the through-hole and the opening.

According to various example embodiments, the electronic device may further include a speaker and/or a microphone that is arranged at least partially in the through-hole and the opening.

According to various example embodiments, the electronic device may further include a physical button that is arranged at least partially in the through-hole and the opening.

According to various example embodiments, at least a portion of the side surface may include a metal.

According to various example embodiments, display elements, which are closest to the side surface, of the plurality of display elements may be located 0 mm to 3 mm away from the side surface.

According to various example embodiments, the electronic device may include a housing comprising a first surface that faces a first direction, a second surface that faces a second direction that is opposite to the first direction, and a side surface between the first surface and the second surface, at least one hardware module arranged inside the housing, a display panel seated in the housing, and a display driving module comprising display driving circuitry configured to drive the display panel to output an image on at least a portion of the display panel. The display panel may include a front surface part that is parallel to the first surface, a bending part, which extends from at least one side of the front surface part and at least a portion of which is bent toward the second direction, and an opening that is formed at one side of the bending part. At least a portion of the hardware module may be inserted into the opening.

According to various example embodiments, the display driving circuit may be connected with the bending part, and is configured to control at least a portion of the front surface part and the bending part such that an image is output on the at least a portion of the front surface part and the bending part.

According to various example embodiments, the bending part may be curved at a constant curvature or be curved at different curvatures based on spacing distances from the front surface part.

According to various example embodiments, a peripheral portion of the front surface part may be curved to define a curved surface.

According to various example embodiments, the curved surface may be curved at a constant curvature or be curved at different curvatures based on spacing distances from the front surface part.

According to various example embodiments, the electronic device may further include a bracket, which is seated on the housing and to which the display panel is fixed. The bending part may surround a portion of the bracket.

According to various example embodiments, the electronic device may further include a support member that is arranged inside the bending part and support a portion of the front surface part and the bending part.

According to various example embodiments, a surface of the support member, which faces the bending part, may be curved at at least one curvature.

According to various example embodiments, the electronic device may further include an absorption member that is arranged inside the bending part and functions as an absorber if an external force is applied to a portion of the front surface part and the bending part.

According to various example embodiments, at least a portion the opening may be aligned with a through-hole that is formed on the side surface of the housing.

According to various example embodiments of the present disclosure, the non-display area formed on the front surface of the electronic device may be reduced by bending the display panel.

Further, according to various example embodiments of the present disclosure, the thickness of the side surface of the electronic device may be reduced by inserting at least a portion of a hardware module in the opening formed in the bending part of the display panel.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of a dedicated processor, a CPU, an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various example embodiments of the present disclosure may be implemented as instructions stored in a computer-readable storage medium in the form of a program module. In the case where the instructions are performed by a processor, the processor may perform functions corresponding to the instructions. The computer-readable storage medium may be, for example, a memory.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been illustrated and described with reference to certain example embodiments thereof, it will be understood by those skilled in the art that various changes in form and details may be made therein without departing from the scope of the present disclosure. Therefore, the scope of the present disclosure should not be defined as being limited to the various example embodiments, but should be defined by the appended claims and equivalents thereof.

What is claimed is:

1. An electronic device comprising:
  a housing comprising a first surface facing a first direction, a second surface facing a second direction opposite to the first direction, and a side surface, the housing including at least one through-hole formed in the side surface thereof;
  a flexible polymer layer comprising a first part disposed below the first surface so as to be viewed through the first surface, a second part extending from a peripheral portion of the first part along at least a portion of the side surface, and a third part extending from the second part and inserted between the first part of the flexible polymer layer and the second surface of the housing, the flexible polymer layer including at least one opening that passes through a portion of the second part and a portion of the third part;
  a plurality of display elements coupled to a surface of the first part of the flexible polymer layer, the plurality of display elements facing the first direction;
  a display driving circuit connected with the third part of the flexible polymer layer and to a printed circuit board, wherein the printed circuit board is disposed between the flexible polymer layer and the second surface of the housing;
  a hardware module disposed below the first part of the flexible polymer layer and disposed at least partially in the opening in the flexible polymer layer; and
  at least one conductive line coupled to the flexible polymer layer, extending along the second part, and electrically connected with the display elements and the display driving circuit, and further arranged around the opening, and
  wherein the through-hole is formed in a third direction perpendicular to the first direction and the second direction, and at least a part of the hole is formed in the first direction, and
  wherein the through-hole and the opening being at least partially aligned with each other so that the hardware module is exposed to the side surface of the housing via the through-hole.

2. The electronic device of claim 1, wherein the polymer layer comprises polyimide.

3. The electronic device of claim 1, wherein the plurality of display elements comprise organic light emitting diodes.

4. The electronic device of claim 1, further comprising:
  a connector at least partially disposed in the through-hole of the housing and the opening in the flexible polymer layer.

5. The electronic device of claim 4, wherein the connector comprises a C-type USB connector.

6. The electronic device of claim 1, further comprising:
  an earphone receptacle at least partially disposed in the through-hole of the housing and the opening in the flexible polymer layer.

7. The electronic device of claim 1, further comprising:
  a the speaker and/or a microphone at least partially disposed in the through-hole of the housing and the opening in the flexible polymer layer.

8. The electronic device of claim 1, further comprising:
  a physical button at least partially disposed in the through-hole of the housing and the opening in the flexible polymer layer.

9. The electronic device of claim 1, wherein at least a portion of the side surface comprises a metal.

10. The electronic device of claim 1, wherein display elements closest to the side surface of the housing, are located 0 mm to 3 mm from the side surface.

11. An electronic device comprising:
  a front cover forming a front surface of the electronic device;
  a back cover forming a rear surface of the electronic device;
  a housing including a first structure forming a side surface of the electronic device and a second structure extending between the front cover and the back cover from the first structure;
  a display panel disposed between the front cover and the back cover, the display panel including an active area and an inactive area around the active area; and
  a hardware module disposed in the second structure; and
  wherein the housing includes a through-hole formed such that the hardware module is exposed to the side surface of the electronic device through the through-hole,
  wherein the inactive area includes a bending part bent from the active area and an extending part extending from the bending part to between the active area and the second structure,
  wherein the extending part includes an opening through which at least a portion of the hardware module is inserted,
  wherein the active area and a portion of the bending part are visible through the front cover, and
  wherein the opening and the hardware module are not visible through the front cover as it is covered by the active area;
  a display driving circuit connected with the extending part of the inactive area and a printed circuit board, wherein the printed circuit board is disposed between the active area of the display panel and the back cover; and at least one conductive line coupled to the active area, extending along the bending part, and electrically connected with the display panel and the display driving circuit, and further arranged around the opening.

12. The electronic device of claim 11, wherein the display driving circuit is connected with the extending part.

13. The electronic device of claim 11, wherein the bending part is curved at a constant curvature or is curved at different curvatures based on spacing distances from the active area of the display panel.

14. The electronic device of claim 11, further comprising:
a support member disposed inside the bending part and configured to support a portion of the front surface part and the bending part.

15. The electronic device of claim 14, wherein a surface of the support member facing the bending part, is curved at at least one curvature.

16. The electronic device of claim 11, further comprising:
an absorption material disposed inside the bending part and configured to absorb at least a portion of an external force applied to a portion of the front surface part and the bending part.

17. The electronic device of claim 11, wherein at least a portion the opening is aligned with the through-hole.

* * * * *